(12) United States Patent
Iwasaki et al.

(10) Patent No.: US 9,469,571 B2
(45) Date of Patent: Oct. 18, 2016

(54) HANDLE SUBSTRATES OF COMPOSITE SUBSTRATES FOR SEMICONDUCTORS

(71) Applicant: NGK INSULATORS, LTD., Aichi-prefecture (JP)

(72) Inventors: Yasunori Iwasaki, Kitanagoya (JP); Akiyoshi Ide, Kasugai (JP); Sugio Miyazawa, Kasugai (JP)

(73) Assignee: NGK INSULATORS, LTD., Aichi-Prefecture (JP)

( * ) Notice: Subject to any disclaimer, the term of this patent is extended or adjusted under 35 U.S.C. 154(b) by 0 days.

(21) Appl. No.: 14/698,994

(22) Filed: Apr. 29, 2015

(65) Prior Publication Data

US 2015/0232389 A1    Aug. 20, 2015

Related U.S. Application Data

(63) Continuation of application No. PCT/JP2014/068473, filed on Jul. 10, 2014.

(30) Foreign Application Priority Data

Jul. 18, 2013  (JP) .................................. 2013-149500

(51) Int. Cl.
*H01L 27/12* (2006.01)
*C04B 35/44* (2006.01)
*B32B 18/00* (2006.01)

(52) U.S. Cl.
CPC ............... *C04B 35/44* (2013.01); *B32B 18/00* (2013.01); *H01L 27/1203* (2013.01); *B32B 2250/02* (2013.01); *B32B 2305/026* (2013.01); *B32B 2457/14* (2013.01)

(58) Field of Classification Search
CPC ............................ H01L 27/1203; C04B 35/44
USPC ........................................................ 257/506
See application file for complete search history.

(56) References Cited

U.S. PATENT DOCUMENTS

| 6,090,648 | A  | 7/2000 | Reedy et al. |
| 6,908,828 | B2 | 6/2005 | Letertre et al. |
| 7,749,870 | B2 | 7/2010 | Kawai et al. |
| 8,088,670 | B2 | 1/2012 | Akiyama et al. |

(Continued)

FOREIGN PATENT DOCUMENTS

| EP | 2428980 A1 | 3/2012 |
| EP | 2930751 A1 | 10/2015 |

(Continued)

OTHER PUBLICATIONS

International Search Report for PCT Patent App. No. PCT/JP2014/068473 (Sep. 9, 2014).

(Continued)

*Primary Examiner* — Christine Enad
(74) *Attorney, Agent, or Firm* — Cermak Nakajima & McGowan LLP; Tomoko Nakajima

(57) ABSTRACT

A handle substrate 1 is made of a translucent ceramics. An average density of pores having a size of 0.5 to 3.0 μm included in a surface region 2A on the side of a bonding face 1a of the handle substrate 1 is 50 counts/mm$^2$ or smaller. It is formed a region 3, whose average density of pores having a size of 0.5 to 3.0 μm is 100 counts/mm$^2$ or larger, in the handle substrate 1. The translucent ceramics has an average grain size of 5 to 60 μm.

11 Claims, 6 Drawing Sheets

(56) References Cited

U.S. PATENT DOCUMENTS

| | | | |
|---|---|---|---|
| 2002/0052288 A1* | 5/2002 | Krell | C04B 38/00 501/105 |
| 2008/0081309 A1* | 4/2008 | Wyllie | A61C 7/141 433/8 |
| 2009/0224442 A1* | 9/2009 | Sakata | A61C 7/00 264/624 |
| 2010/0317132 A1* | 12/2010 | Rogers | H01L 25/0753 438/27 |
| 2012/0119336 A1 | 5/2012 | Akiyama | |
| 2016/0046528 A1 | 2/2016 | Miyazawa et al. | |

FOREIGN PATENT DOCUMENTS

| | | |
|---|---|---|
| JP | 5-009064 A | 1/1993 |
| JP | 5-160240 A | 6/1993 |
| JP | 8-512432 A | 12/1996 |
| JP | 11-26339 A | 1/1999 |
| JP | 11-156703 A | 6/1999 |
| JP | 2003-224042 A | 8/2003 |
| JP | 2008-288556 A | 11/2008 |
| JP | 2009-246320 A | 10/2009 |
| JP | 2009-246321 A | 10/2009 |
| JP | 2009-246323 A | 10/2009 |
| JP | 2009-252755 A | 10/2009 |
| JP | 2010-278341 A | 12/2010 |
| WO | WO2010-128666 A1 | 11/2010 |
| WO | WO2010/132552 A1 | 11/2010 |
| WO | WO 2014174946 A1 * 10/2014 ......... H01L 21/7624 |  |

OTHER PUBLICATIONS

Written Opinion for PCT Patent App. No. PCT/JP2014/068473 (Sep. 9, 2014) with English language translation of relevant parts.
International Preliminary Report on Patentability for PCT Patent App. No. PCT/JP2014/068473 (Jan. 19, 2016).
European Search Report for European Patent App. No. 14826358.5 (Mar. 21, 2016).

\* cited by examiner

Unit length of straight line (for example 500 μ m)

Number of grains = 22, 23, 19
(at three different positions)

HANDLE SUBSTRATES OF COMPOSITE SUBSTRATES FOR SEMICONDUCTORS

TECHNICAL FIELD

The present invention relates to a handle substrate of a composite substrate for a semiconductor.

BACKGROUND OF THE INVENTION

According to prior arts, it has been known to obtain SOI including a handle substrate composed of a transparent and insulating substrate and called Silicon on Quartz (SOQ), Silicon on Glass (SOG) or Silicon on Sapphire (SOS), and adhered wafer by bonding a transparent wide-gap semiconductor including GaN, ZnO, diamond, AlN or the like to a donor substrate such as silicon. SOQ, SOG, SOS and the like are expected for applications such as a projector and high frequency device due to the insulating property and transparency of the handle substrate. Further, the composite wafer, which is obtained by adhering a thin film of the wide-gap semiconductor to the handle substrate, is expected in applications such as a high performance laser and power device.

It has been used, in a high frequency switching IC or the like, an adhered substrate including a base substrate of sapphire having characteristics of high insulating property, low dielectric loss and high thermal conduction and a silicon thin film formed on the surface for providing a semiconductor device. According to prior arts, it was generally performed a method of forming a silicon region on a base substrate by epitaxial growth. It has recently developed a method of directly bonding them to contribute to the improvement of performance of the semiconductor device (Patent documents 1, 2 and 3).

However, as sapphire is expensive, it is desired to use a substrate made of a material, other than sapphire, for the handle substrate for reducing the cost. As to the development of the bonding technique described above, it has been proposed various kinds of handle substrates of materials other than sapphire, such as quartz, glass, alumina or the like.

Among them, polycrystalline transparent alumina had been used for a luminous vessel for a high-luminance discharge lamp and a dummy wafer for a semiconductor production system. By using a material of high purity and densifying it through sintering in reducing atmosphere at a high temperature, it is possible to realize excellent characteristics such as high insulation, low dielectric loss and high thermal conduction comparable to those of sapphire alleviating the need of a crystal growing step requiring a high cost (Patent documents 4, 5 and 6).

In the case that a translucent base substrate is used, it cannot be appropriately detected with an optical sensor in a semiconductor production system to result in troubles in the system. For preventing this, it was proposed methods of subjecting a back face of a base substrate to sandblasting, lithography or laser processing to roughen it (Patent documents 7, 8, 9, 10, 11 and 12). It was further proposed a method of lowering a density of a crystalline translucent substrate to reduce its translucent property (Patent document 12).

PRIOR DOCUMENTS (Patent document 1) Japanese Patent Publication No. H08-512432A
(Patent document 2) Japanese Patent Publication No. 2008-224042A
(Patent document 3) Japanese Patent Publication No. 2010-278841A
(Patent document 4) WO 2010/128666 A1
(Patent document 5) Japanese Patent Publication No. H05-160240A
(Patent document 6) Japanese Patent Publication No. H05-160240A
(Patent document 7) Japanese Patent Publication No. 2008-288556A
(Patent document 8) Japanese Patent Publication No. 2009-246320A
(Patent document 9) Japanese Patent Publication No. 2009-246321A
(Patent document 10) Japanese Patent Publication No. 2009-246323A
(Patent document 11) Japanese Patent Publication No. 2009-252755A
(Patent document 12) Japanese Patent Publication No. H11-026339A

SUMMARY OF THE INVENTION

Problems to be Solved by the Invention

However, according to each of methods described in patent documents 7 to 11, as an additional processing is performed to form the roughened surface, it may result in contamination of a main face side due to the processing and fracture and deformation of a wafer, and the additional process step is required. Further, the density of the handle substrate is lowered as described in patent document 12, fine pores in the substrate is increased. The surface roughness after polishing the adhered face is thereby deteriorated so that it cannot be properly bonded to a silicon region.

An object of the present invention is to provide a handle substrate of a composite substrate for a semiconductor, in which the handle substrate can be easily detected by an optical sensor and the reduction of its bonding strength to a donor substrate can be prevented.

Means for Solving the Problem

The present invention provides a handle substrate of a composite substrate for a semiconductor; the handle substrate comprising a translucent ceramics. The handle substrate includes a surface region on a side of a bonding face of said handle substrate, the surface region comprises pores having a size of 0.5 to 3.0 μm at an average density of 50 counts/mm$^2$ or smaller, the handle substrate comprises a region formed therein comprising pores having a size of 0.5 to 3.0 μm at an average density of 100 counts/mm$^2$ or larger, and the translucent ceramics has an average grain size of 5 to 60 μm.

The present invention further provides a composite substrate for a semiconductor, wherein the composite substrate includes the handle substrate and a donor substrate bonded with the bonding face of the handle substrate directly or through a bonding region.

Effects of Invention

The inventors have investigated and tried to produce a handle substrate with a polycrystalline ceramics. The polycrystalline ceramics has crystalline structure including many fine grains bonded with each other. The inventors reached the idea of reducing pores along a main face on the side of bonding and of leaving a region including many pores inside of the handle substrate, in such polycrystalline ceramics.

By applying the structure leaving the region including many pores in the inside of the handle substrate, it is possible to easily detect the handle substrate by means of an optical sensor. At the same time, by applying the structure of reducing the pores along the main face on the side of bonding, it becomes possible to extremely lower Ra at the bonding face after the processing and to prevent the reduction of the bonding strength to a donor substrate.

EMBODIMENTS FOR CARRYING OUT THE INVENTION

Figure 1A:
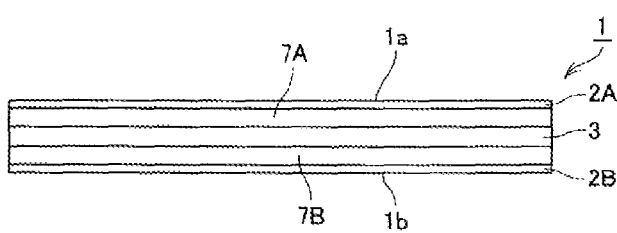
FIG. 1(a) is a schematic view showing a handle substrate 1 according to an embodiment of the present invention.

The present invention will be described further, referring to the drawings appropriately.
(Handle Substrate)

The handle substrate used in the present invention is composed of a translucent ceramics. Although it is not particularly limited, it may preferably be selected from the group consisting of silicon oxide, aluminum oxide, aluminum nitride, silicon carbide, silicon nitride, sialon and gallium nitride.

Translucent alumina ceramics may most preferably be used as the material of the handle substrate. This is because an extremely dense sintered body can be obtained, so that fracture and cracks of the handle substrate are hardly generated.

In the case that the translucent alumina sintered body is produced, 100 ppm or more and 1000 ppm or less of magnesium oxide powder is added to high-purity alumina powder preferably having a purity of 99.9 percent or higher (preferably 99.95 percent or higher). Such high-purity alumina powder includes high-purity alumina powder produced by Taimei Chemical Industries Corporation. Further, the purity and average particle size of the magnesium oxide powder may preferably be 99.9 percent or higher and 0.6 μm or smaller, respectively.

Figure 2A:
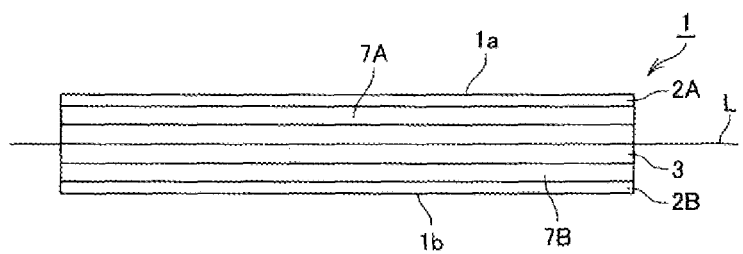
FIG. 2(a) is a view showing the handle substrate 1 in which a central line L viewed in the direction of thickness is drawn.
Figure 2B:
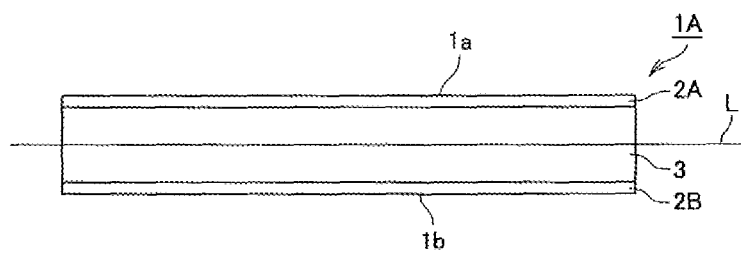
FIG. 2(b) shows a handle substrate 1A according to another embodiment.

FIGS. 1(a) and 2(a) show a handle substrate 1 according to an embodiment of the present invention, and FIG. 2(b) shows a handle substrate 1A according to another embodiment.

An average density of pores having a size of 0.5 to 3.0 μm included in a surface region 2A on the side of a bonding face 1a of the handle substrate 1 or 1A is 50 counts/mm$^2$ or smaller. It is thereby possible to make Ra of the bonding face 1a of the handle substrate after the processing 3.0 nm or smaller and to strengthen the bonding with a donor substrate. On the viewpoint, the average density of pores having a size of 0.5 to 3.0 μm included in a surface region 2A on the side of the bonding face 1a may preferably be 20 counts/mm$^2$ or smaller and more preferably be 10 counts/mm$^2$ or smaller. The lower limit of it is not particularly defined and may be 0 count/mm$^2$.

It is not required that an average density of pores having a size of 0.5 to 3.0 μm included in a surface region 2B on the side of a bottom face 1b of the handle substrate 1 or 1A is 60 counts/mm$^2$ or smaller. However, if too many pores are present, contamination or removal of grains tends to occur. The average density of pores having a size of 0.5 to 3.0 μm included in the surface region 2B on the side of the bottom face 1b of the handle substrate 1 or 1A may preferably be 100 counts/mm$^2$ or smaller and more preferably be 50 counts/mm$^2$ or smaller.

Further, in the inside of the handle substrate 1, it is formed a region 3 having an average density of pores having a size of 0.5 to 3.0 μm of 100 counts/mm$^2$ or larger. As shown in FIG. 2(b), the region 3 may occupy the whole region excluding the surface regions 2A and 2B. Alternatively, as shown in FIG. 1(a), the region 3 may occupy only a part of the whole excluding the surface regions 2A and 2B.

By forming the region 3, having an average density of pores having a size of 0.5 to 3.0 μm of 100 counts/mm$^2$ or larger, in the handle substrate 1, it becomes possible to easily detect the handle substrate by means of an optical sensor or the like. Although the upper limit of the average density of the pores in the region is not particularly defined, too many pores tend to result in the reduction of the strength and removal of grains. On such viewpoint, the average density may preferably be 1000 counts/mm$^2$ or less and more preferably be 400 counts/mm$^2$ or less.

Further, between the region 3 and surface region 2A, it may be provided a region 7A having an average density of pores having a size of 0.5 to 3.0 μm of less than 100 counts/mm$^2$. In this case, the lower limit of the average density of pores of the region 7A is not particularly defined. Further, in the region 7A, both of the region having a average density of 50 counts/mm$^2$ or less and the region having an average density of more than 50 counts/mm$^2$ may be present.

Further, between the region 3 and surface region 2B, it may be provided a region 7B having an average density of pores having a size of 0.5 to 3.0 μm of less than 100 counts/mm$^2$. In this case, the lower limit of the average density of the pores in the region 7B is not particularly defined. Further, in the region 7B, both of the region having an average density of the pores of 50 counts/mm$^2$ or less and the region having an average density of more than 50 counts/mm$^2$ may be present.

Further, according to the viewpoint of the present invention, a ratio (Nc:Ns) may preferably be 1:2 to 1:40, provided that Nc represents an average density of the pores in the surface region on the side of the bonding face and Ns represents an average density of the pores in the region through which the central line L in the direction of thickness of the substrate passes. In the case that the ratio is low, the desired effects would not be obtained, and in the case that it is too high, unbalanced stress is generated during the sintering to result in cracks. On the viewpoint, the ratio (Nc:Ns) may preferably be 1:8 to 1:40 and more preferably be 1:12 to 1:40.

According to the present invention, the average density of the pores is determined as follows.

That is, a cross section (cross section perpendicular to the bonding face) of the handle substrate is subjected to mirror face polishing and thermal etching to sharpen grain boundaries and its photograph is then taken by means of an optical microscope (at a magnification of 200). It is then set a layer-shaped visual fields having sizes of 0.1 mm in the direction of thickness (direction perpendicular to the bonding face) of the handle substrate and of 1.0 mm in the direction parallel with the bonding face. The visual fields are exemplified in FIGS. 4, 5 and 6. As to each visual field, it is then counted a number of the pores having a size of 0.5 to 3.0 μm. The thus obtained number of the pores is converted to a number of pores per an unit $mm^2$, which is defined as the average density.

Figure 4:
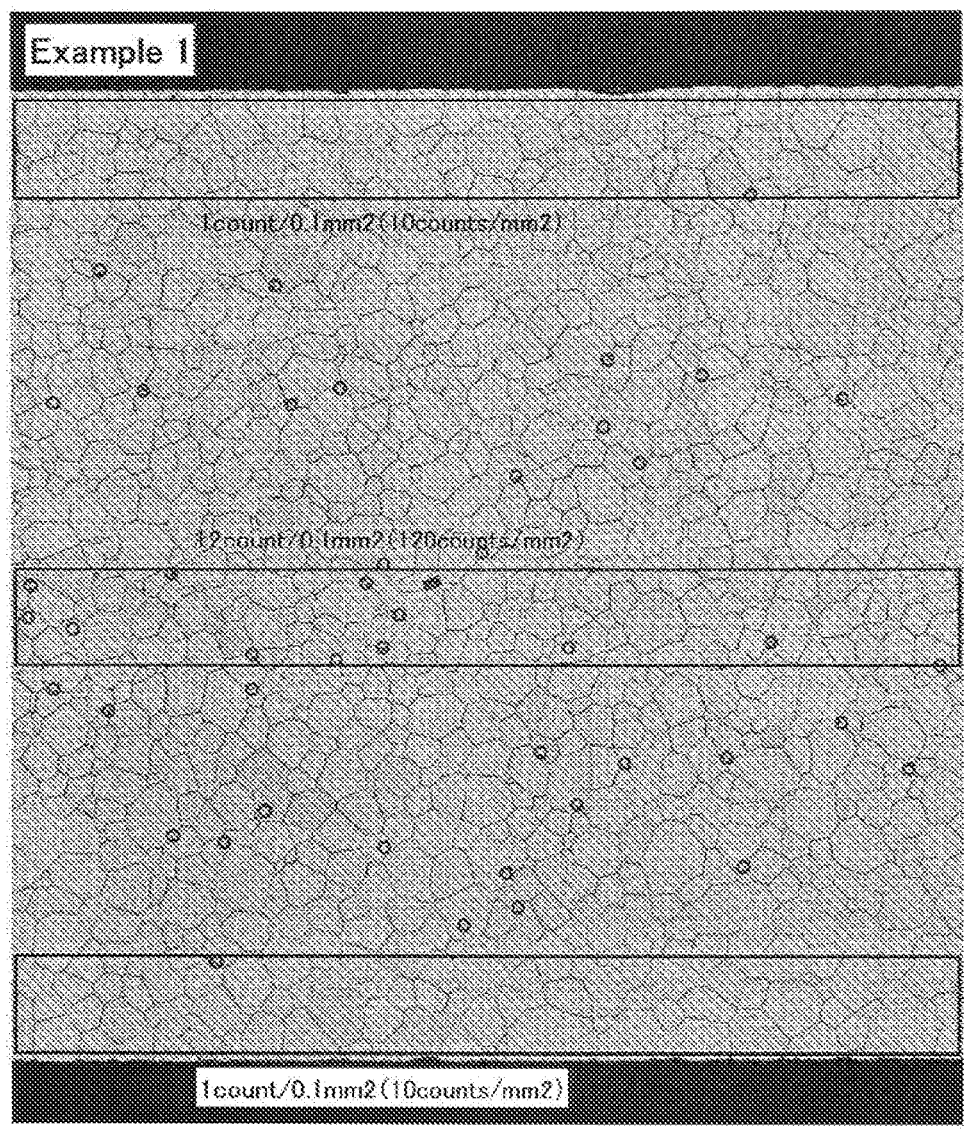
FIG. 4 is a photograph for illustrating a method of calculating crystal grains and pores.

For example, according to the example 1 shown in FIG. 4, the number of the pore was 1 in a visual field in the surface region on the side of the bonding layer (upper side), the number of the pores was 12 in the visual field through which the central line in the thickness direction passes, and the number of the pore was 1 in the visual field in the surface region on the side of the bottom face. The average densities of the pores were 10 counts/$mm^2$, 120 counts/$mm^2$ and 10 counts/$mm^2$, respectively.

Figure 5:
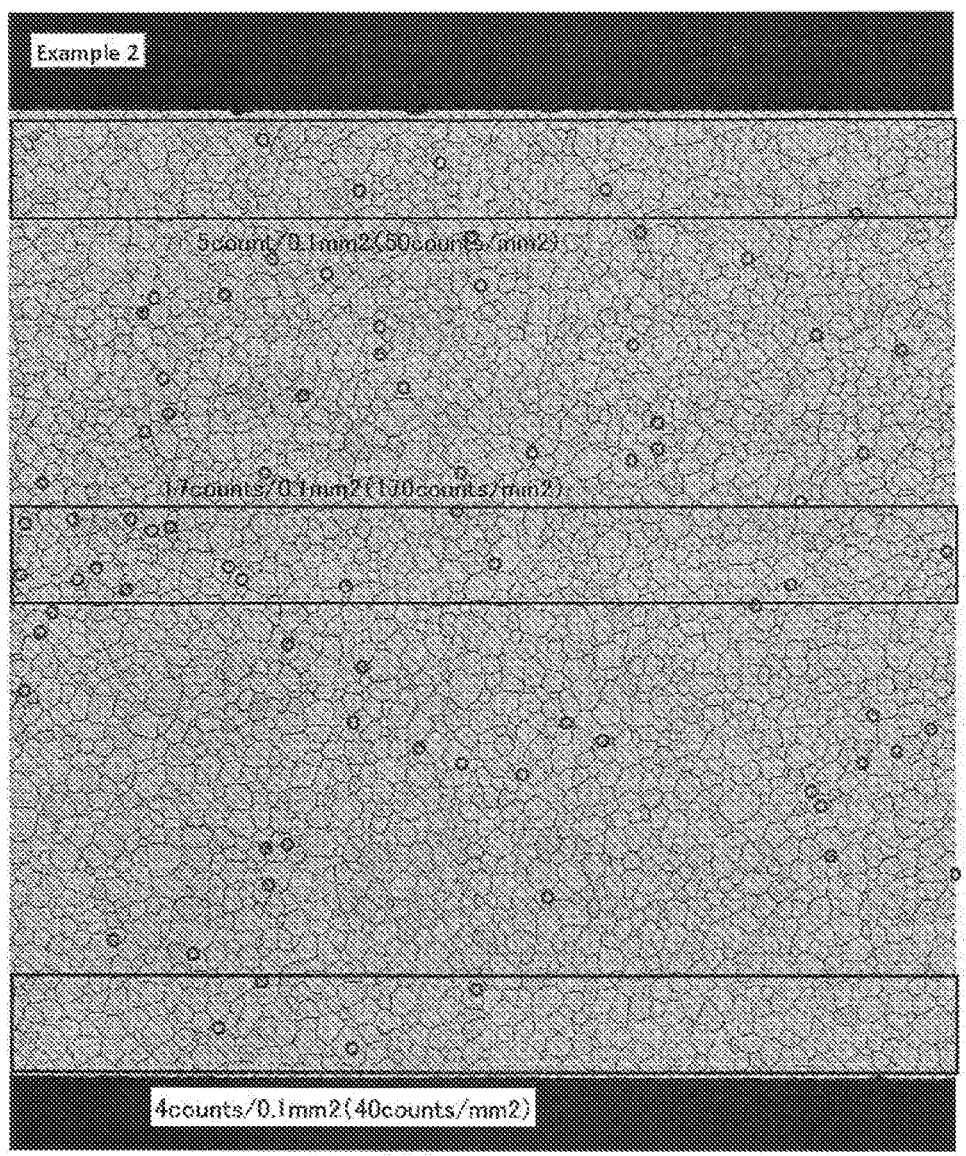
FIG. 5 is a photograph for illustrating a method of calculating crystal grains and pores.

Similarly, according to the example 2 of FIG. 5, the number of the pores was 5 in a visual field in the surface region on the side of the bonding layer (upper side), the number of the pores was 17 in the visual field through which the central line in the thickness direction passes, and the number of the pores was 4 in the visual field in the surface region on the side of the bottom face. The average densities of the pores were 50 counts/$mm^2$, 170 counts/$mm^2$ and 40 counts/$mm^2$, respectively.

Figure 6:
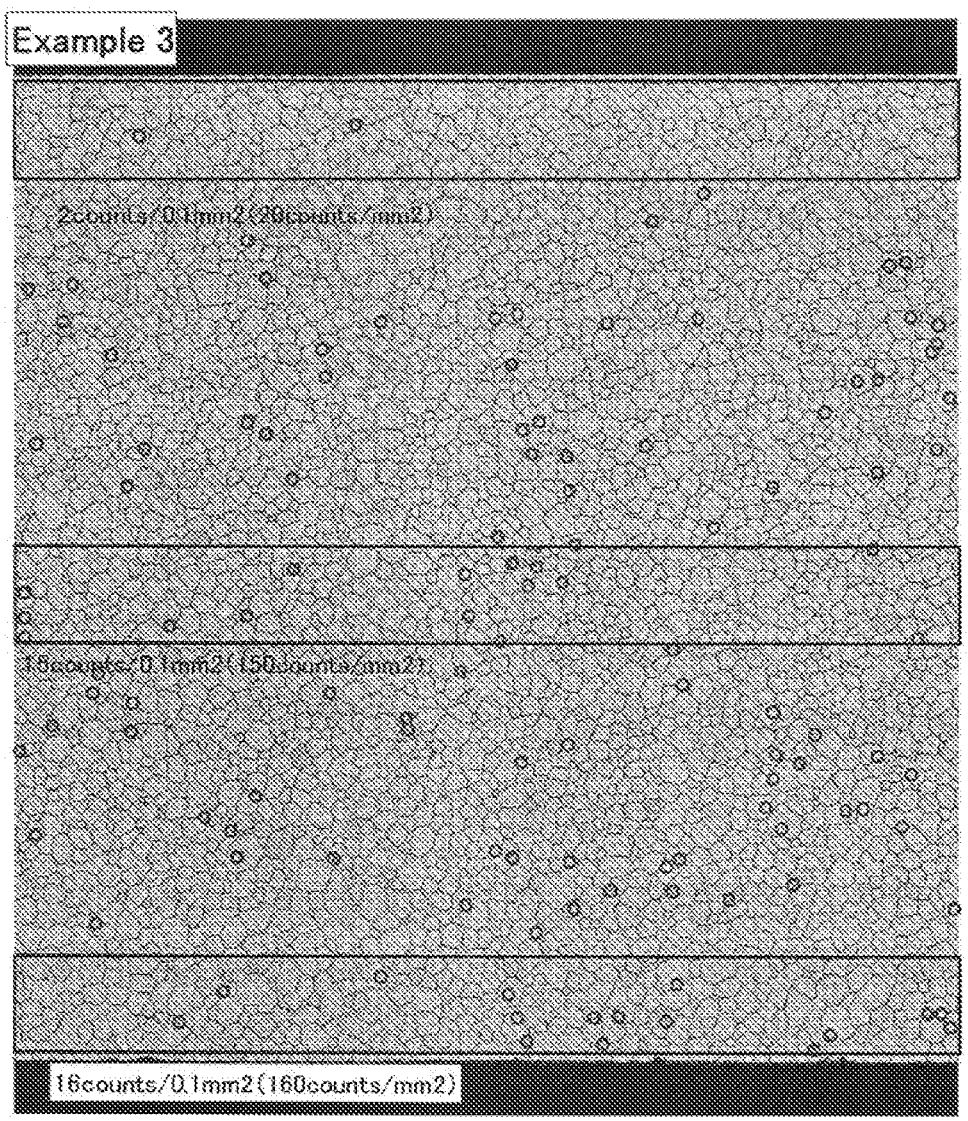
FIG. 6 is a photograph for illustrating a method of calculating crystal grains and pores.

According to the example 3 of FIG. 6, the number of the pores was 2 in the visual field in the surface region on the side of the bonding layer (upper side), the number of the pores was 15 in the visual field through which the central line in the thickness direction passes, and the number of the pores was 16 in the visual field in the surface region on the side of the bottom face. The average densities of the pores were 20 counts/$mm^2$, 150 counts/$mm^2$ and 160 counts/$mm^2$, respectively.

Further, in the case that the average density of the pores is calculated according to the present invention, the handle substrate is divided into layered regions from the bonding face to the bottom face. The thickness of each of the regions is made 0.1 mm. Then, in each region, it is set the visual field for measurement described above having a thickness of 0.1 mm and a length of 1.0 mm.

Then, the region 3, having an average density of pores with a size of 0.5 to 3.0 μm of 100 counts/$mm^2$ or more, includes the single layer of a thickness of 0.1 mm and may preferably include a plurality of the regions each having a thickness of 0.1 mm or larger (for example two regions, three regions or the like), on the viewpoint of the present invention.

Here, pores having a size less than 0.5 μm are excluded, because it is too small compared with the visual field so that it is difficult to count and its influence on the surface state during precision polishing is small. Further, pores having a size larger than 3.0 μm are excluded, because the pores are too large and simply provide recesses and pores having such size are not usually observed in a dense ceramics used for a handle substrate. In the case that removal of grains or the like occurs and is difficult to distinguish from pores in mirror polishing the cross section, FIB (Focused Ion Beam) processing may be used for the processing of the cross section so that its influence can be excluded.

Further, the size of the pore is determined as follows. That is, in the photograph of the cross section of the handle substrate, it is drawn a straight line parallel with the bonding face to pass through the pore. A plurality of the straight lines can be drawn in this case, the maximum of the lengths of the straight lines passing through the pore is defined as the size of the pore.

According to the present invention, the central line average surface roughness Ra in microscopic view of the bonding face is 3.0 nm or smaller, so that it is possible to improve the bonding force to the donor substrate. On the viewpoint, the central line average surface roughness Ra of the bonding face in microscopic view may more preferably be 1.0 nm or smaller.

Besides, it is a numerical value obtained by taking an image of an exposed face of each crystal grain exposed to the surface by means of AFM (Atomic Force Microscope) and by calculating it according to JIS B0601. In the case that the surface roughness of the surface of each crystal grain is observed microscopically, it is used observation of surface morphology in a visual field of 10 μm by means of an atomic force microscope.

According to a preferred embodiment, the average grain size of the translucent ceramics is 5 to 60 μm and preferably be 15 to 55 μm. As the average grain size is small, the removal of grains tends to occur during the polishing to result in deterioration of surface roughness. Further in the case that it is large, micro cracks are generated during the sintering to result in deterioration of surface roughness. By adjusting the average grain size in the range described above, it becomes easier to lower the microscopic central line surface roughness Ra and to improve the bonding strength to the donor substrate due to intermolecular force.

Besides, the average grain size of the crystal grain is measured as follows.

(1) After a cross section of a sintered body is subjected to mirror face polishing and thermal etching to sharpen the crystal grain boundaries, its microscopic photograph (at a magnification of 100 to 200) is taken to count a number of grains through which a straight line having an unit length passes. This is performed at three different positions. Besides, the unit length was made in a range of 500 μm to 1000 μm.

(2) It is taken an average of the numbers of the grains at the three performed positions.

(3) An average grain size is calculated according to the following formula.

(Calculation Formula)

$$D=(4/\pi \times (L/n)$$

(D: Average grain size, L: unit length of straight line, n: average of numbers of grains at the three positions)

Figure 3:
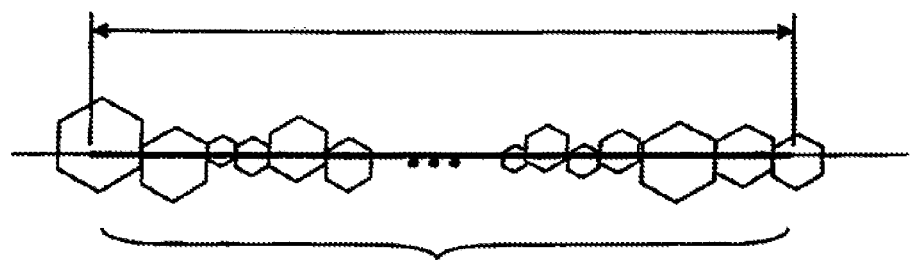
FIG. 3 is a schematic view showing an example of calculating procedure of an average grain size.

FIG. 3 shows an example of the calculation of the average grain size. In the case that numbers of grains through which a straight line of an unit length (for example 500 μm) are 22, 23 and 19, respectively, at three different positions, the average grain size D is:

$$D=(4/\pi) \times [500/(22+23+19)/3\}]=29.9 \text{ μm}$$

according to the calculation formula described above.

On the viewpoint of the present invention, the in-line transmittance of light having a wavelength of 650 nm of the handle substrate may preferably be 60 percent or lower.

Further, although the size and thickness of the handle substrate are not particularly limited, the handleability is better in the case that it has those near conventional SEMI/JEITA standards. Further, the thickness of the handle substrate may preferably be 0.3 mm or larger and preferably be 1.5 mm or smaller.

The relative density of the polycrystalline ceramics forming the handle substrate may preferably be 98 percent or larger and more preferably be 99 percent or larger, on the viewpoint of endurance against the subsequent process of a semiconductor and prevention of contamination of it.

(Production of Handle Substrate)

The average particle size (primary particle size) of powdery raw material is not particularly limited, and may preferably be 0.6 μm or smaller and more preferably be 0.4 μm or smaller, on the viewpoint of densification by the sintering at a low temperature. More preferably, the average particle size of the powdery raw material is 0.3 μm or smaller. The lower limit of the average particle size is not particularly limited. The average particle size of the powdery raw material can be determined by direct observation of the powdery raw material using SEM (Scanning type electron microscope).

Besides, the average particle size means an average value of n=500 values of (length of the longest axis+length of the shortest axis)/2 of primary particles, excluding secondary aggregated particles, in optional two visual fields in SEM photograph at a magnification of ×30000.

Methods of molding the handle substrate are not particularly limited, and may be an optional process such as doctor blade, extrusion, gel casting or the like. Most preferably, the substrate is produced utilizing doctor blade method as follows.

(1) Ceramic powder, polyvinyl butyral resin (PVB resin) or acrylic resin functioning as a binder, a plasticizer and a dispersing agent are dispersed in a dispersing medium to produce slurry, which is molded into a tape using doctor blade method and the dispersing medium is then dried to solidify the slurry.

(2) A plurality of the thus obtained tapes are laminated and subjected to press or CIP lamination to obtain a molded body having a desired thickness and substrate shape.

For obtaining the handle substrate according to the present invention, its sintering temperature may preferably be 1700 to 1900° C. and more preferably be 1750 to 1850° C., on the viewpoint of the densification of the sintered body.

Further, after it is generated the sufficiently dense sintered body by the sintering, it is preferred to perform additional annealing treatment. The annealing temperature may preferably be from the maximum temperature during the sintering plus 50° C. to the maximum temperature minus 50° C. and may more preferably be from the maximum temperature during the sintering to the maximum temperature plus 50° C., on the viewpoint of selectively reduce the pores in the surface region according to the present invention. Further, the annealing time period may preferably be 1 to 6 hours.

Further, the substrate is positioned on a flat plate made of a high-melting point metal such as molybdenum during the sintering. In this time, it is preferred to form a space of 5 to 10 mm over the substrate, on the viewpoint of facilitating the discharge of a sintering aid and growth of grains. This is because the move of intergranular boundaries accompanied with the grain growth can facilitate the discharge of the pores. On the other hand, in the case that the sintering aid is discharged too much, abnormal growth of the grains tends to occur to result in a cause of cracks. It is more preferred to perform the annealing so that a plate such as molybdenum plate is mounted over the substrate and the substrate is sandwiched between the upper and lower plates.

The molding and sintering are performed as described above to obtain a blank substrate made of a ceramic sintered body.

Further, a ceramic molded body containing a larger amount of a sintering aid and a ceramic molded body containing a smaller amount of a sintering aid may be integrated and then sintered, so that it is possible to obtain a blank substrate whose number of the pores in the surface region is reduced. By applying such production method, it becomes easier to control the porosities of the respective layers to make the ratio of Nc:Ns higher.

The sintered body has microstructure in which many fine ceramic grains are bonded together. The surface of the blank substrate is subjected to high-precision polishing so that each crystal grain is polished along a plane and the polished crystal grains, each having a flat surface, are exposed to the surface. The surfaces of the polished crystal grains become smooth.

The blank substrate is subjected to precision polishing, so that the microscopic central line average surface roughness Ra of the surface of each crystal grain is made lower. As such polishing process, CMP (Chemical mechanical polishing) process is generally used, and as the polishing slurry for use, it is used alkaline or neutral solution in which abrasives having a particle diameter of 80 nm to 200 nm are dispersed. As a material for the abrasives, silica, alumina, diamond, zirconia and ceria can be listed, and those may be used alone or in combination. Further, as the polishing pad, a hard urethane pad, non-woven fabric pad and suedo pad can be exemplified.

Further, it is preferred to perform annealing treatment after a rough polishing treatment and before finally performing the precise polishing treatment. As atmospheric gas for the annealing treatment, air, hydrogen, nitrogen, argon and vacuum are exemplified. The annealing temperature may preferably be 1200 to 1600° C. and the annealing time period may preferably be 2 to 12 hours. It is thereby possible to facilitate the discharge of the sintering aid without adversely affecting the smoothness of the surface.

In the case that the handle substrate is made of translucent alumina, by making an addition amount of magnesium oxide into the raw material for producing the handle substrate 100 ppm or more, it is possible to facilitate the densification of the handle substrate and to prevent the reduction of the bonding strength to the donor substrate due to cracks and pores in the vicinity of the bonding face. On the viewpoint, an addition amount of magnesium oxide may preferably be made 160 ppm or more. Further, by making the addition amount of magnesium oxide 1000 ppm or less, it becomes easier to prevent the diffusion of magnesium from the handle substrate to the donor substrate.

(Composite Substrate for Semiconductor)

The composite substrate of the present invention can be utilized for a light-emitting device for a projector, high frequency device, high performance laser, power device, logic IC or the like.

The composite substrate includes the inventive handle substrate and a donor substrate.

Materials of the donor substrates are not particularly limited, and may preferably be selected from the group consisting of silicon, aluminum nitride, gallium nitride, zinc oxide and diamond. The thickness of the donor substrate is not particularly limited, and may be near that of conventional SEMI/JEIDA standard on the viewpoint of handling.

The donor substrate may include the above described material whose surface may include an oxide film. It is because the effect of preventing channeling of implanted ions by performing ion implantation through the oxide film. The oxide film preferably has a thickness of 50 to 500 nm. Such donor substrate including the oxide film is also categorized as the donor substrate, and it is called donor substrate unless specifically indicated.

Figure 1B:
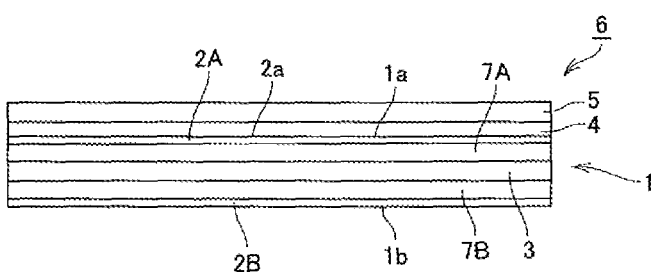
FIG. 1(b) is a schematic view showing a composite substrate 6 obtained by bonding a donor substrate 5 onto the handle substrate 1 through a bonding region 4.
Figure 1C:
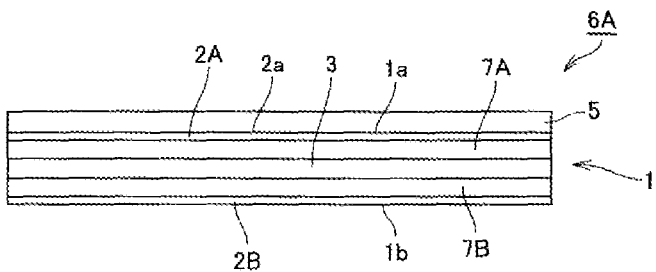
FIG. 1(c) is a schematic view showing a composite substrate 6A obtained by directly bonding the donor substrate 5 onto the handle substrate 1.

For example according to a composite substrate 6 shown in FIG. 1(b), after a handle substrate 1 is obtained, a donor substrate 5 is bonded to a bonding face 1a of the handle substrate 1 through a bonding region 4. According to a composite substrate 6A of FIG. 1(c), the donor substrate 5 is directly bonded to the bonding face 1a of the handle substrate 1. In these cases, as the bonding face 1a of the handle substrate 1 is smooth in microscopic view, it is possible to make the bonding strength to the donor substrate large.

Embodiment of Bonding

As a technique used for the bonding, it may be used direct bonding through surface activation and substrate bonding technique using an adhesive region, for example, although it is not particularly limited.

As the direct bonding, it may be appropriately used low-temperature bonding technique through surface activation. After the surface activation is performed in vacuum of about $10^{-6}$ Pa using Ar gas, a single crystalline material, such as Si, can be bonded to a polycrystalline material through an adhesive region such as $SiO_2$ at ambient temperature.

As an example of the adhesive region, in addition to the adhesion using a resin, $SiO_2$, $Al_2O_3$ and SiN are used.

EXAMPLES

Example 1

It was produced a handle substrate 1 using translucent alumina sintered body, for conforming the effects of the present invention.

First, it was produced a blank substrate made of translucent alumina sintered body. Specifically, it was produced slurry by mixing the following ingredients.

(Powdery Raw Material)

| | |
|---|---|
| α-alumina powder having a specific surface area of 3.5 to 4.5 m²/g and an average primary particle size of 0.35 to 0.45 μm | 100 weight parts |
| MgO (magnesia) | 0.025 weight parts |
| $ZrO_2$ (zirconia) | 0.040 weight parts |
| $Y_2O_3$ (yttria) | 0.0015 weight parts |
| (Dispersing medium) | |
| 2-ethyl hexanol | 45 weight parts |
| (Binder) | |
| PVB resin | 4 weight parts |
| (Dispersing agent) | |
| High molecular surfactant | 3 weight parts |
| (Plasticizer) | |
| DOP | 0.1 weight parts |

This slurry was molded into tape-shaped bodies by doctor blade method so that its thickness after the sintering becomes 0.25 mm. Four layers of them were laminated by pressing to obtain a powder-molded body having a shape of a substrate whose thickness after the sintering becomes 1 mm.

The thus obtained powder molded body was calcined (preliminary sintering) in air at 1100° C., then sintered in atmosphere of hydrogen 3: nitrogen 1 at 1750° for 3 hours, and then annealed at 1700° C. for 3 hours.

The thus produced blank substrate was subjected to high-precision polishing. First, both faces were subjected to lapping using green carbon to adjust the shape, and the surface was then subjected to single-face lapping using diamond slurry. This was subjected to annealing treatment at 1300° C. for 6 hours in atmosphere and then subjected to CMP polishing using colloidal silica, for obtaining the target surface roughness. During this, the total amount of processing was adjusted at 400 μm in depth and the amount of processing after the annealing was adjusted at 10 μm. Further, the substrate after the processing was washed by alternately immersing it in ammonia peroxide, hydrochloric acid peroxide, sulfuric acid, fluoric acid, aqua regia and pure water to produce a handle substrate 1.

As to the thus obtained handle substrate, it was measured the thickness of the region whose average density of the pores having a size of 0.5 to 3.0 μm is 100 counts/mm² or larger, the average density of the pores having a size of 0.5 to 3.0 μm in the surface region on the side of the bonding face, the ratio (Nc/Ns) of the average density (Nc) of the pores in the surface region on the side of the bonding face to the average density (Ns) of the pores in the region through which the central line in the thickness direction of the substrate passes, the average crystal grain size, availability of detection by an optical sensor, and Ra on the bonding face. The results were shown in table 1.

TABLE 1

| | Examples | | | | | |
|---|---|---|---|---|---|---|
| | 1 | 2 | 3 | 4 | 5 | 6 |
| Thickness of region 3 whose average density of pores is 100 counts/mm2 or larger [mm] | 0.5 | 0.8 | 0.5 | 0.2 | 0.5 | 0.2 |
| Average density of pores in region 3 [counts/mm2] | 120 | 160 | 170 | 100 | 100 | 100 |
| Average density of pores in surface region on bonding face [counts/mm2] | 10 | 20 | 50 | 50 | 50 | 20 |

TABLE 1-continued

| | | | | | | |
|---|---|---|---|---|---|---|
| Nc:Ns | 1:12 | 1:8 | 1:3 | 1:2 | 1:2 | 1:5 |
| Average grain size [μm] | 55 | 20 | 20 | 20 | 20 | 20 |
| In-line transmittance [%] | 45 | 40 | 45 | 50 | 45 | 50 |
| Availability of detection by optical sensor | Possible | Possible | Possible | Possible | Possible | Possible |
| Ra [nm] | 1.0 | 2.0 | 3.0 | 3.0 | 3.0 | 1.8 |
| Remarks | | | | | | |

| | Examples | | | | |
|---|---|---|---|---|---|
| | 7 | 8 | 9 | 10 | 11 |
| Thickness of region 3 whose average density of pores is 100 counts/mm2 or larger [mm] | 0.1 | 0.1 | 0.4 | 0.4 | 0.6 |
| Average density of pores in region 3 [counts/mm2] | 120 | 120 | 400 | 1000 | 1400 |
| Average density of pores in surface region on bonding face [counts/mm2] | 15 | 10 | 10 | 30 | 30 |
| Nc:Ns | 1:8 | 1:12 | 1:40 | 1:33 | 1:47 |
| Average grain size [μm] | 60 | 60 | 20 | 5 | 20 |
| In-line transmittance [%] | 60 | 60 | 40 | 15 | 35 |
| Availability of detection by optical sensor | Possible | Possible | Possible | Possible | Possible |
| Ra [nm] | 1.8 | 0.9 | 0.8 | 1.6 | 2.0 |
| Remarks | | | | | 1/10 Cracks generated |

Examples 2 to 8

Handle substrates were produced similarly as the Example 1. However, the sintering temperature, annealing temperatures after the sintering, annealing time period, annealing temperature after the lapping and annealing time period after the lapping were changed. The thus obtained results of the measuring were shown in table 1.

Examples 9, 10 and 11

Handle substrates were produced similarly as the Example 1. However, amounts of magnesium oxide in the two layers on the surface sides and the central two layers, among the four tape-shaped molded layers 4, were changed. The thus obtained results of the measuring were shown in table 1. Besides, according the Example 11, cracks were generated after the annealing in one of ten samples produced.

Comparative Examples 1 to 4

Handle substrates were produced similarly as the Example 1. However, the sintering temperature, annealing temperature after the sintering, annealing time period, annealing temperature after the lapping and annealing time period after the lapping were changed. The thus obtained results of the measuring were shown in table 2.

TABLE 2

| | Comparative example | | | |
|---|---|---|---|---|
| | 1 | 2 | 3 | 4 |
| Thickness of region whose average density of pores is 100 counts/mm2 or larger [mm] | None | 0.4 | 0.2 | 0.2 |
| Average density of pores in region 3 [counts/mm2] | 90 | 190 | 110 | 190 |
| Average density of pores in surface region on bonding face [counts/mm2] | 30 | 60 | 40 | 50 |
| Nc:Ns | 1:3 | 1:3 | 1:3 | 1:4 |
| Average grain size [μm] | 20 | 20 | 65 | 3 |
| In-line transmittance [%] | 65 | 50 | — | 30 |
| Availability of detection by optical sensor | impossible | possible | — | possible |
| Ra [nm] | 2.5 | 4.0 | 4.0 | 8.0 |
| Remarks | | Surface roughness is large | Micro cracks observed | Surface roughness is large |

(Test of Bonding)

An $SiO_2$ region was formed on a surface of each of the handle substrates of the Examples 1 to 11, as the adhering region to a silicon thin plate. However, as to the Example 11, it was used a sample in which the cracks were not generated. The film-forming method was plasma CVD and CMP polishing (chemical mechanical polishing) was performed after the film-formation so that the film thickness of the finally obtained $SiO_2$ region was made 100 nm. Thereafter, the Si substrate and $SiO_2$ region were directly bonded by plasma-assisted activation method to fabricate a composite substrate of Si—$SiO_2$-handle substrate. As a result, good bonding state was realized and cracks, peeling and fracture were not observed. Further, as the thus obtained composite substrate was subjected to heat treatment at 1000° C. for 30 minutes, the bonding state was not changed and cracks, peeling or the like was not observed.

On the other hand, the silicon substrate was bonded to the surface of each of the handle substrates 2 and 4, as described above. As each of the composite substrates was subjected to heat treatment at 1000° C. for 30 minutes, peeling was observed in a part of it. Besides, the handle substrate of the comparative example 1 could not be detected by an optical sensor, and the bonding test was not performed in the handle substrate of the comparative example 3 as cracks were observed.

The invention claimed is:

1. A handle substrate of a composite substrate for a semiconductor; said handle substrate comprising a translucent ceramic,
   said handle substrate comprising a surface region on a side of a bonding face of said handle substrate, said surface region comprising pores having a size of 0.5 to 3.0 μm at an average density of 50 counts/mm$^2$ or smaller, and
   said handle substrate comprising a region formed therein comprising pores having a size of 0.5 to 3.0 μm at an average density of 100 counts/mm$^2$ or larger,
   wherein said translucent ceramic has an average grain size of 5 to 60 μm,
   wherein said translucent ceramic has a relative density of 98 percent or higher, and
   wherein a ratio of said average density of said pores in said surface region on a side of said bonding face to an average density of said pores in a region through which a central line of said substrate in a direction of thickness passes is 1:2 to 1:40.

2. The handle substrate of claim 1, comprising pores having a size of 0.5 to 3.0 μm at an average density of 1000 counts/mm$^2$ or smaller in said handle substrate.

3. The handle substrate of claim 1, wherein said translucent ceramic comprises polycrystalline alumina.

4. The handle substrate of claim 1, wherein a microscopic central line average surface roughness Ra of said bonding face of said handle substrate is 3.0 nm or smaller, and
   wherein an in-line transmittance of a light having a wavelength of 650 nm is 60 percent or lower.

5. A composite substrate for a semiconductor, said composite substrate comprising said handle substrate of claim 1 and a donor substrate bonded to said bonding face of said handle substrate directly or through a bonding region.

6. The composite substrate of claim 5, wherein said donor substrate comprises monocrystalline silicon.

7. A handle substrate of a composite substrate for a semiconductor; said handle substrate comprising a translucent ceramic,
   said handle substrate comprising a surface region on a side of a bonding face of said handle substrate, said surface region comprising pores having a size of 0.5 to 3.0 μm at an average density of 50 counts/mm$^2$ or smaller, and
   said handle substrate comprising a region formed therein comprising pores having a size of 0.5 to 3.0 μm at an average density of 100 counts/mm$^2$ or larger,
   wherein said translucent ceramic has an average grain size of 5 to 60 μm,
wherein said translucent ceramic has a relative density of 98 percent or higher,
   wherein a microscopic central line average surface roughness Ra of said bonding face of said handle substrate is 3.0 nm or smaller, and
   wherein an in-line transmittance of a light having a wavelength of 650 nm is 60 percent or lower.

8. The handle substrate of claim 7, comprising pores having a size of 0.5 to 3.0 μm at an average density of 1000 counts/mm$^2$ or smaller in said handle substrate.

9. The handle substrate of claim 7, wherein said translucent ceramic comprises polycrystalline alumina.

10. A composite substrate for a semiconductor, said composite substrate comprising said handle substrate of claim 7 and a donor substrate bonded to said bonding face of said handle substrate directly or through a bonding region.

11. The composite substrate of claim 10, wherein said donor substrate comprises monocrystalline silicon.

* * * * *